United States Patent
Wang et al.

(10) Patent No.: US 7,067,904 B2
(45) Date of Patent: Jun. 27, 2006

(54) FLIP-CHIP TYPE QUAD FLAT PACKAGE AND LEADFRAME

(75) Inventors: Hsueh-Te Wang, Kaohsiung (TW); Meng-Jen Wang, Pingtung (TW); Chi-Hao Chiu, Pingdung (TW); Chien Liu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/979,881

(22) Filed: Nov. 1, 2004

(65) Prior Publication Data

US 2005/0104167 A1    May 19, 2005

(30) Foreign Application Priority Data

Oct. 31, 2003    (TW)    ............... 92130406 A

(51) Int. Cl.
*H01L 23/495*    (2006.01)
*H01L 23/48*    (2006.01)

(52) U.S. Cl. ............ 257/673; 257/778; 257/666; 257/734; 257/737

(58) Field of Classification Search ............... 257/666, 257/673, 778, 786, 773, 776, 734, 737, E23.033, 257/E23.69
See application file for complete search history.

(56) References Cited

U.S. PATENT DOCUMENTS 6,661,087 B1 * 12/2003 Wu .......................... 257/692
6,917,098 B1 *  7/2005 Yamunan ................... 257/666

* cited by examiner

*Primary Examiner*—Jasmine Clark
(74) *Attorney, Agent, or Firm*—J.C. Patents

(57) ABSTRACT

A flip-chip type quad flat package and a leadframe. The leadframe comprises a bump-connecting area and a non-connecting area. The maximum width of the bump-connecting area is larger than the width of the non-connecting area. A bump is limited to the bump-connecting area after performing a reflow process so that the bumps are prevented from collapsing, the manufacturing cost is reduced and the process is simplified.

12 Claims, 3 Drawing Sheets

FLIP-CHIP TYPE QUAD FLAT PACKAGE AND LEADFRAME

CROSS-REFERENCE TO RELATED APPLICATION

This application claims the priority benefit of Taiwan application serial no. 92130406, filed on Oct. 31, 2003.

BACKGROUND OF THE INVENTION

1. Field of the Invention

The present invention relates to a flip-chip type quad flat package (FC-QFP) and a leadframe. More particularly, the present invention relates to a flip-chip type quad flat package and a leadframe that can prevent abnormal collapse of bumps, lower the production cost and simplify the production process.

2. Description of the Related Art

The techniques for fabricating semiconductor devices are progressing at a rapid pace. With great advances in production techniques, many types of customized, multi-functional and yet compact and handy electronic products have been developed. In the semiconductor fabrication industry, leadframe is still one of the most commonly used carriers. According to the configuration of the leads in a leadframe, a quad flat package (QFP) can be divided into quad flat package with I-type leads (QFI), quad flat package with J-type leads (QFJ) and quad flat non-leaded package (QFN). The leads in the leadframe of the quad flat non-leaded package (QFN) are cut to align with the four sides of the chip package. It should be noted that quad flat packages have a shorter average trace so that signal transmission speed is faster. As a result, quad flat package has become one of the main options for fabricating a high frequency (for example, radio frequency bandwidth) chip package with a low pin count.

FIG. 1 is a side view of a conventional quad flat non-leaded package. FIG. 2 is a bottom view of the quad flat non-leaded package of FIG. 1. As shown in FIGS. 1 and 2, a conventional quad flat non-leaded package 100 mainly comprises a chip 110, a leadframe 120 and an encapsulant 130. The chip 110 has an active surface 112 and a corresponding back surface 114. Here, the active surface 112 is the surface on the chip 110 where active devices are formed. The active surface 112 of the chip 110 further comprises a plurality of exposed bonding pads 116.

The leadframe 120 comprises a plurality of leads 122 each having a top surface 122a and a bottom surface 122b. The bonding pads 116 on the chip 110 are connected to the top surface 122a of leads 122 through various bumps 140 so that the bonding pads 116 and the leads 122 are electrically connected. The encapsulant 130 encapsulates the chip 110, the bumps 140 and the top surface 122a of the leads 122 but exposes the bottom surface 122b of the leads 122 (as shown in FIG. 2).

FIG. 3 is a side view of a bump formed on the top surface of one of the leads in a conventional quad flat non-leaded package. In the conventional method of fabricating a quad flat non-leaded package, a bump 140 is typically formed on the top surface 122a at the end of each lead 122. Because the bump 140 is directly formed on the top surface 122a of the lead 122, the bump 140 may collapse due to the wetting of the solder ball during the reflow process. Ultimately, the height of the collapsed bump 140 is hard to control.

FIG. 4 is a perspective view showing another type of lead in a conventional quad flat non-leaded package. As shown in FIGS. 1 and 4, an additional solder mask 150 is formed on the top surface 122a of the leads 122 to prevent the collapse of bumps 140. The solder mask 150 has an opening 152 that exposes a portion of the top surface 122a near the end of the lead 122. It should be noted that the openings 152 formed in the solder mask 150 is used to limit the wetting area of the bumps 140. Furthermore, the solder mask 150 is not wettable. Hence, the solder material will not wet the solder mask 150 when the bumps 140 are bonded to the top surfaces 122a of the leads 122. In other words, the bumps 140 will precisely form inside the opening 152. However, the conventional process of forming a solder mask on the leads is complicated (need to pattern the solder mask to form openings) and expensive.

SUMMARY OF THE INVENTION

The present invention provides a leadframe with leads each having a bump-connecting area at one end such that the maximum width in each bump-connecting area is greater than the width at other areas of the leads. Hence, bumps formed on the leads after a reflow process are always confined within the bump-connecting areas so that the bumps are prevented from collapsing to an indefinite height.

The present invention provides a flip-chip type quad flat package that does not require the formation of a solder mask layer with an opening at one end of each lead to confine the bump location. Hence, the production cost can be lowered and the processing steps can be simplified.

As embodied and broadly described herein, the invention provides a leadframe. The leadframe has a plurality of leads comprising a bump-connecting area and a non-connecting area. The maximum width of each bump-connecting area is a first width while the non-connecting area has a second width. The first width is greater than the second width and the ratio of the first width to the second with is greater than 1.2.

The present invention also provides a flip-chip type quad flat package comprising a chip, a leadframe, a plurality of bumps and some packaging material. The chip has an active surface and a corresponding back surface. The active surface has a plurality of bonding pads thereon. The leadframe comprises at least a plurality of leads and each lead has a bottom surface. Each lead comprises a bump-connecting region and a non-connecting area. The maximum width of each bump-connecting area is a first width while the non-connecting area has a second width. The first width is greater than the second width and the ratio of the first width to the second with is greater than 1.2. The bumps are disposed between the bump-connection area and the bonding pads such that the bonding pads and the leads are electrically connected through the bumps. The bumps have a diameter identical to the first width, for example. The encapsulant encapsulates the chip, the leadframe and the bumps but exposes the bottom surface of the leads.

In one embodiment of the present invention, the ratio between the first width to the second width is, for example, smaller than 3. In addition, the ratio of the diameter of the bumps to the second with is, for example, between 1.07~1.71. Furthermore, the bump-connecting area is a circular area, for example.

In one embodiment of the present invention, the leadframe further comprises a heat sink. The aforementioned leads are arranged adjacent to an edge of the heat sink so that the heat generated by the chip can be dissipated away from the package body.

In the present invention, the maximum width of the bump-connecting area at the end of the lead is designed to be greater than the width of the non-connecting area. After performing a reflow process, the bumps are confined by the bump-connecting areas. Thus, the bumps are prevented from collapsing to an indefinite height. Moreover, by forming a bump-connecting area capable of confining the bump at the end of a lead, there is no need to form a solder mask with an opening on the top surface of the lead. Hence, the process is simplified and overall production cost is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
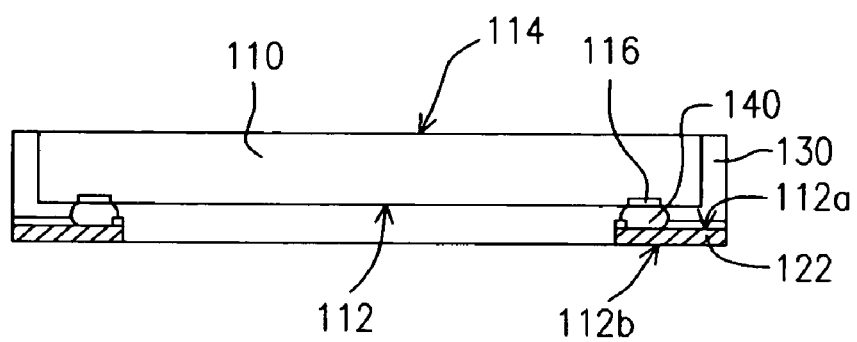
FIG. 1 is a side view of a conventional quad flat non-leaded package.
Figure 2:
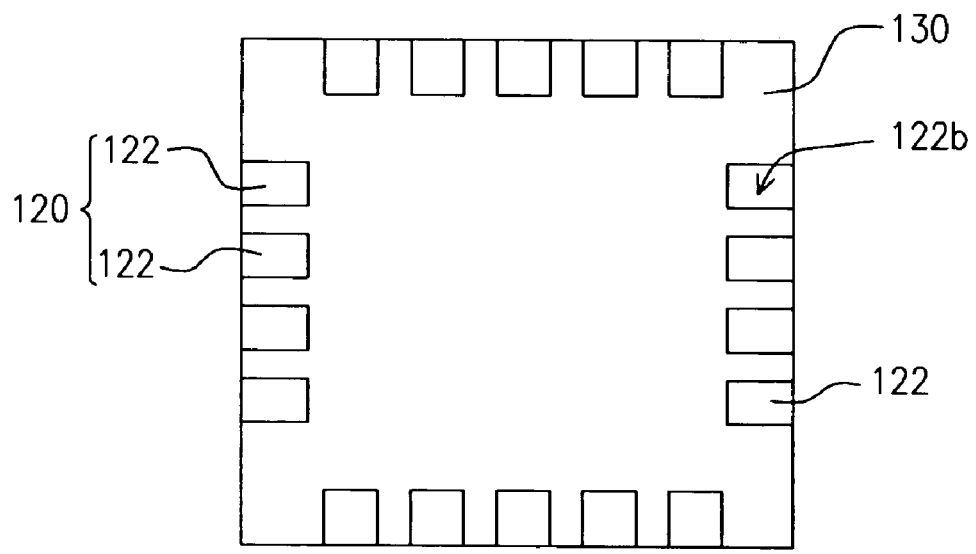
FIG. 2 is a bottom view of the quad flat non-leaded package of FIG. 1.
Figure 3:
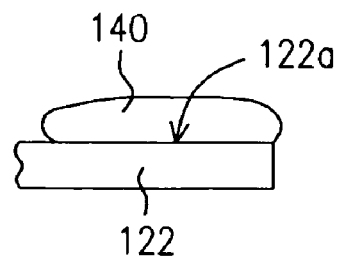
FIG. 3 is a side view of a bump formed on the top surface of one of the leads in a conventional quad flat non-leaded package.
Figure 4:
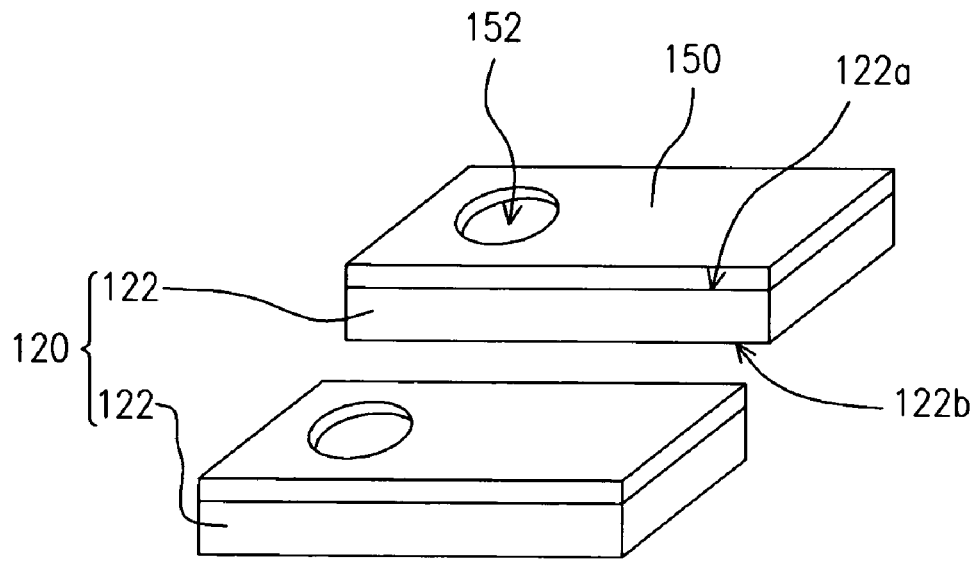
FIG. 4 is a perspective view showing another type of lead in a conventional quad flat non-leaded package.

Reference will now be made in detail to the present embodiments of the invention, examples of which are illustrated in the accompanying drawings. Wherever possible, the same reference numbers are used in the drawings and the description to refer to the same or like parts.

Figure 5:
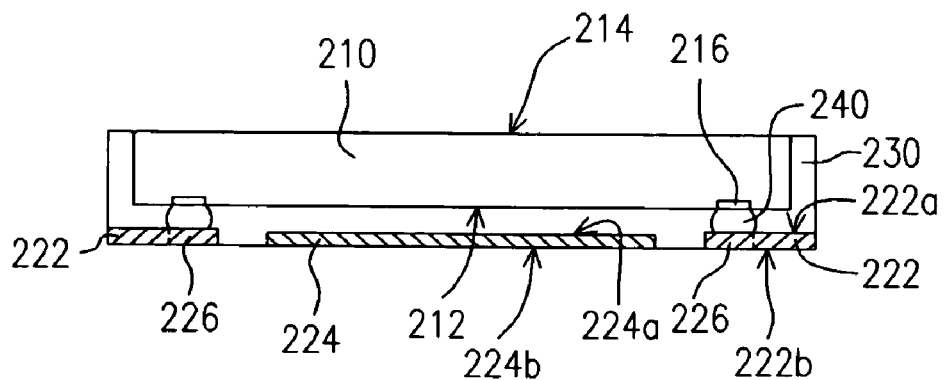
FIG. 5 is a side view of a flip-chip type quad flat package according one embodiment of the present invention.
Figure 6:
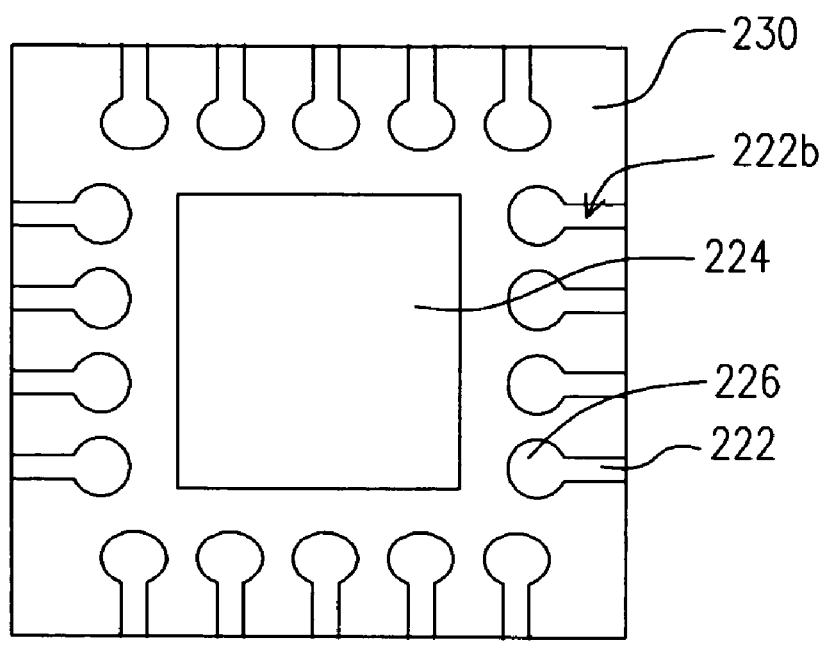
FIG. 6 is a bottom view of the flip-chip type quad flat package shown in FIG. 5.

FIG. 5 is a side view of a flip-chip type quad flat package according one embodiment of the present invention. FIG. 6 is a bottom view of the flip-chip type quad flat package shown in FIG. 5. As shown in FIGS. 5 and 6, the quad flat non-leaded chip package 200 of the present invention mainly comprises a chip 210, a leadframe 220 and an encapsulant 230. The chip 210 has an active surface 212 and a corresponding back surface 214. The active surface 212 is a surface where the active devices are formed. The active surface 212 of the chip 210 further comprises a plurality of exposed bonding pads 216.

The leadframe 220 comprises a plurality of leads 222. Each lead 222 has a top surface 222a and a bottom surface 222b. In addition, the bonding pads 216 on the chip 210 are connected to the top surface 222a of the leads 222 through various bumps 240 so that the bonding pads 216 and the leads 222 are electrically connected. The encapsulant 230 encapsulates the chip 210, the bumps 240 and the top surface 222a of the leads 222 but exposes the bottom surface 222b of the leads 222 (as shown in FIG. 6). Furthermore, the leadframe 220 comprises a heat sink 224. The leads 222 are arranged adjacent to the edge of the heat sink 224, for example. The heat sink has a top surface 224a and a corresponding bottom surface 224b. Preferably, the bottom surface 224b of the heat sink 224 is exposed outside the encapsulant 230. The top surface 224a of the heat sink 224 may contact the back surface 214 of the chip 210 so that the heat sink 224 can dissipate the heat generated by the chip 210 away from the package and increase the heat-dissipating function.

Figure 7:
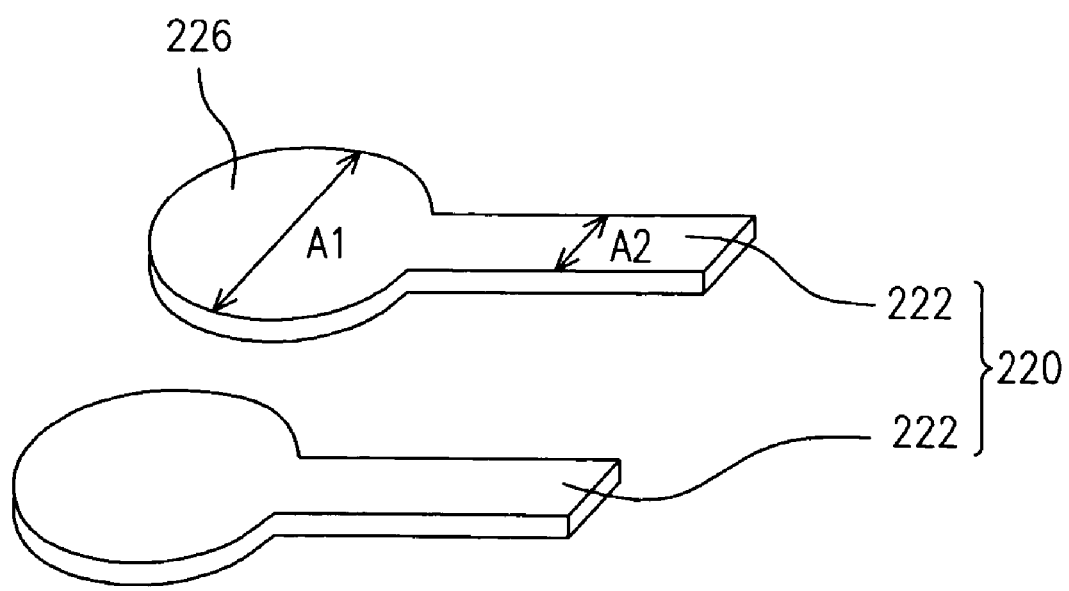
FIG. 7 is a perspective view showing the leads in a flip-chip type quad flat package according to the present invention.

FIG. 7 is a perspective view showing the leads in a flip-chip type quad flat package according to the present invention. As shown in FIGS. 5, 6 and 7, one major aspect of the present invention is the formation of a bump-connecting area 226 at the end of each lead 222. The maximum width of each bump-connecting area 226 is a first width A1 while the non-connecting area of the leads 222 have a second width A2. The first width A1 is greater than the second width A2 (as shown in FIG. 7) and the ratio of the first width A1 to the second with A2 is at least greater than 1.2, and preferably between 1.2~3. Moreover, the aforementioned bumps 240 have a diameter identical to the first width A1, for example. In addition, the ratio of the diameter of the bumps 240 to the second with is, for exampl, between 1.07~1.71. Furthermore, the shape of the bump-connecting area 226 is not restricted. In the present embodiment, the bump-connecting area 226 can be a circular region. The bumps 240 are disposed between the bump-connecting area 226 and the bonding pads 216 so that the bonding pads 216 and the leads 222 are electrically connected through the bumps 240 (as shown in FIG. 5).

In the present embodiment, a is formed at the end of each lead 222 such that bump-connecting area 226 has a greater width A1 than the non-connecting area. Furthermore, the bump-connecting area 226 is designed to have a circular shape. Hence, the melted solder ball material during a reflow process is confined within the bump-connecting area 226 due to cohesion rather than spreading to other areas of the lead 222. Unlike the collapse bump 140 on a lead 122 when a solder mask 150 (shown in FIG. 1) is not used in the conventional fabricating process, all the bumps 240 in the present invention have a stable bump height.

In addition, by forming a bump-connecting area capable of confining the bump at the end of a lead, there is no need to form a solder mask with an opening on the top surface of the lead. Hence, the process is simplified and overall production cost is reduced.

In the aforementioned embodiments, a quad flat non-leaded package (QFN) is used as an example. However, one skilled artisan may apply the design to other types of quad flat packages (QFP) including I-type quad flat package (QFI) and J-type quad flat package (QFJ).

In summary, major advantages of the present invention includes:

1. A bump-connecting area having a width greater than other areas of the lead is formed at one end of the lead so that the bump is confined to the bump-connecting area after a reflow process. Thus, the bumps are prevented from collapsing to an indefinite height.

2. By forming a bump-connecting area capable of confining the bump at the end of a lead, there is no need to form a solder mask with openings on the top surface of the leads. Hence, the process is simplified and overall production cost is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A leadframe having a plurality of leads, wherein each lead comprises a bump-connecting area and a non-connecting area, the maximum width of each bump-connecting area is a first width while each non-connecting area has a second width, the first width is greater than the second width and the ratio of the first width to the second with is greater than 1.2.

2. The leadframe of claim 1, wherein the ratio of the first width to the second width is smaller than 3.

3. The leadframe of claim 1, wherein the bump-connecting area has a circular shape.

4. The leadframe of claim 1, further comprising a heat sink such that the leads are arranged adjacent to an edge of the heat sink.

5. A flip-chip type quad flat package, comprising:
a chip having an active surface and a corresponding back surface, wherein the active surface has a plurality of bonding pads thereon;
a leadframe having a plurality of leads, wherein each lead comprises a bump-connecting area and a non-connecting area, and the maximum width of each bump-connecting area is a first width while each non-connecting area has a second width, the first width is greater than the second width and the ratio of the first width to the second with is greater than 1.2;
a plurality of bumps disposed between the bump-connecting area of the leads and the bonding pads for electrically connecting the bonding pads and the leads; and
an encapsulant for encapsulating the chip, the leadframe and the bumps but exposing the bottom surface of the leads.

6. The flip-chip type quad flat package of claim 5, wherein the ratio of the first width to the second width is smaller than 3.

7. The flip-chip type quad flat package of claim 5, wherein the ratio of the diameter of the bumps to the second width is between 1.07~1.71.

8. The flip-chip type quad flat package of claim 5, wherein the bump-connecting area has a circular shape.

9. The flip-chip type quad flat package of claim 5, further comprising a heat sink having a top surface and a corresponding bottom surface such that the leads are arranged adjacent to an edge of the heat sink.

10. The flip-chip type quad flat package of claim 9, wherein the encapsulant exposes the bottom surface of the heat sink.

11. The flip-chip type quad flat package of claim 9, wherein the top surface of the heat sink is in contact with the back surface of the chip.

12. The flip-chip type quad flat package of claim 5, wherein the bumps have a diameter identical to the first width.

* * * * *